(12) United States Patent
Kinyua et al.

(10) Patent No.: US 8,773,297 B2
(45) Date of Patent: Jul. 8, 2014

(54) SYSTEM AND METHOD FOR PULSE WIDTH MODULATION DIGITAL-TO-ANALOG CONVERTER

(71) Applicant: Taiwan Semiconductor Manufacturing Co., Ltd., Hsin-Chu (TW)

(72) Inventors: Martin Kinyua, Cedar Park, TX (US); Eric Soenen, Austin, TX (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/685,178

(22) Filed: Nov. 26, 2012

(65) Prior Publication Data
US 2014/0062748 A1 Mar. 6, 2014

Related U.S. Application Data

(63) Continuation-in-part of application No. 13/597,290, filed on Aug. 29, 2012.

(51) Int. Cl.
*H03M 1/66* (2006.01)
(52) U.S. Cl.
USPC .................. 341/150; 341/143; 341/144
(58) Field of Classification Search
USPC ........................... 341/143–144, 150
See application file for complete search history.

(56) References Cited

U.S. PATENT DOCUMENTS

| | | | | |
|---|---|---|---|---|
| 5,008,674 | A | * | 4/1991 | Da Franca et al. ............ 341/150 |
| 5,323,157 | A | * | 6/1994 | Ledzius et al. ................ 341/143 |
| 6,177,896 | B1 | * | 1/2001 | Min ............................... 341/143 |
| 6,177,897 | B1 | * | 1/2001 | Williams, III ................ 341/150 |
| 6,531,973 | B2 | * | 3/2003 | Brooks et al. ................. 341/143 |
| 6,816,097 | B2 | * | 11/2004 | Brooks et al. ................. 341/143 |
| 6,950,049 | B2 | * | 9/2005 | Brooks et al. ................. 341/143 |
| 7,256,720 | B2 | * | 8/2007 | Fukuda ......................... 341/143 |

OTHER PUBLICATIONS

Van Tuijl, E. et al., "A 128fs Multi-Bit ΣΔCMOS Audio DAC with Real-Time DEM and 115dB SFDR", ISSCC 2004/Session 20/Digital-To-Analog-Converters/20.5, 8 pages.
Nguyen, K. et al., "A 108 dB SNR, 1.1 mW Oversampling Audio DAC With a Three-level DEM Technique", IEEE Journal of Solid-State Circuits, Dec. 2008, 43(12):2592-2600.

\* cited by examiner

*Primary Examiner* — Khai M Nguyen
(74) *Attorney, Agent, or Firm* — Duane Morris LLP (57) ABSTRACT

A system and method is disclosed for a digital to analog converter which includes an interpolation filter to up-sample a digital signal, a noise shaping modulator to suppress in-band quantization errors due to digital pulse width modulation and truncation errors, and a hybrid finite impulse response filter/digital to analog converter coupled to a reconstruction filter which outputs the analog signal. The hybrid finite impulse response filter/digital to analog converter uses N-taps implemented digitally and N-tap weights implemented in analog using switched capacitors.

20 Claims, 8 Drawing Sheets

SYSTEM AND METHOD FOR PULSE WIDTH MODULATION DIGITAL-TO-ANALOG CONVERTER

RELATED APPLICATION

The instant application is a continuation-in-part of U.S. application Ser. No. 13/597,290, entitled "System and Method for Pulse Width Modulation Digital-to-Analog Converter" filed 29 Aug. 2012, the entirety of which is hereby incorporated herein by reference.

BACKGROUND

Many electrical circuits operate on digital data since there are known advantages to using digital circuit devices. However, some applications require that the output of the digital circuits be converted to the analog domain so that the output can be perceived more easily by humans as well as other entities that are more adapted to receiving and interpreting analog signals than digital signals. Thus, there remains a need to convert digital data into an analog output, for example for audio devices, video devices, and other devices for which an analog signal is advantageous.

The efficient and accurate conversion of digital signals to analog signals, especially at high data rates, continues to be prone to a number of problems, such as performance degradation due to unmatched rise/fall times of the output analog signal, clock jitter limitations, intersymbol interference, and relatively high harmonic distortion, to name a few. Additionally, current digital-to-analog ("DAC") converters sometimes employ multi-bit truncation DACs, which require Dynamic Element Matching schemes to suppress static nonlinearity conversion errors.

Traditionally, a DAC can be implemented in either discrete time or in continuous time, each with its own drawbacks. For example, discrete time implementations having switched capacitors have a dynamic range that is limited by thermal noise, require a large bandwidth for the reconstruction amplifier/low pass filter, and typically requires more area in a circuit due to the need for large charge transfer capacitors. Continuous time implementations generate distortion and in-band noise due to the unmatched rise/fall times and intersymbol interference, are very sensitive to clock jitter, and multi-bit truncation and noise filters can mitigate sensitivity.

Thus, there is a need for an efficient and accurate DAC that can overcome these and other problems with current DACs.

DETAILED DESCRIPTION

With reference to the figures where like elements have been given like numerical designations to facilitate an understanding of the present subject matter, various embodiments of a system and method for compensating for timing misalignments are described. In order to more fully understand the present subject matter, a brief description of applicable circuitry will be helpful.

A system and method is disclosed for a digital to analog converter which includes an interpolation filter to up-sample a digital signal, a noise shaping modulator to suppress in-band quantization errors due to digital pulse width modulation and truncation errors, and a hybrid finite impulse response filter/digital to analog converter coupled to a reconstruction filter which outputs the analog signal.

Figure 1:
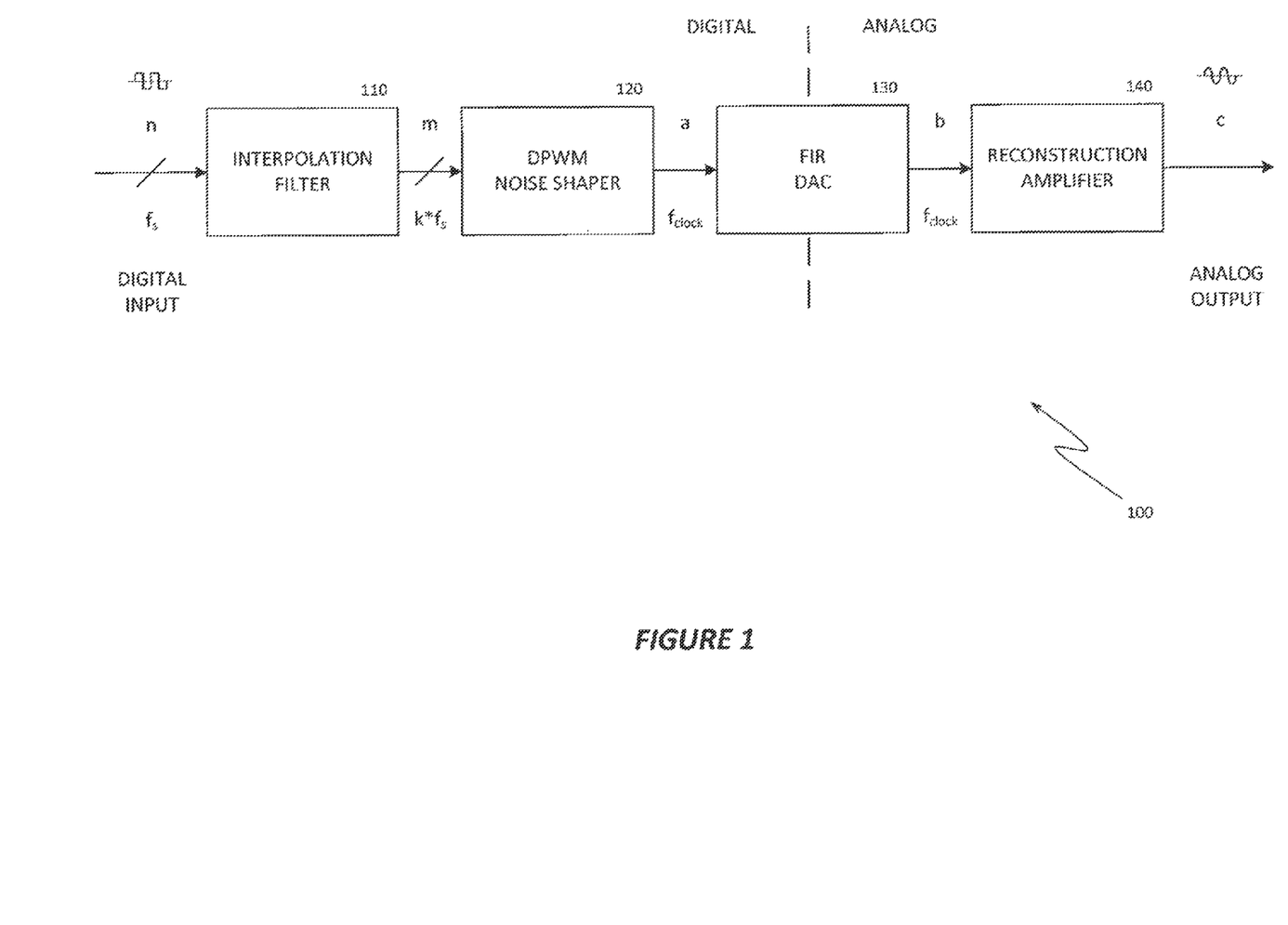
FIG. 1 is an illustration of a high-level functional block diagram of a digital to analog converter ("DAC") circuit according to an embodiment of the present subject matter.

Referring to FIG. 1, a high-level functional block diagram 100 of a digital to analog converter circuit according to an embodiment of the present subject matter is illustrated. An input digital signal "n" is input to the interpolation filter 110. In certain embodiments, the digital signal n is a digital audio signal which may be comprised of any standard number of bits (e.g., 16, 20, or 24 bits) having been formed from an analog signal at a particular sampling rate "$f_s$", as is known in the art. In certain embodiments, the sampling rate is selected to be 48, 96, or 192 kHz, although the scope of the present subject matter contemplates many other sampling rates as are known in the art. For example, the present subject matter contemplates sampling rates in the range of 16-400 kHz. Furthermore, in certain embodiments the digital signal n is a pulse code modulation ("PCM") digital signal.

The interpolation filter 110 upsamples the digital signal n by a predetermined amount "k" where the upsample factor k is typically, but not limited to, a value in the range of 64-1024. Other ranges are contemplated by the present subject matter, such as the range of 32-2048. Thus, the output digital signal from the interpolation filter is digital signal "m" at a rate of $k*f_s$, as shown. The digital signal m is passed to the Digital Pulse Width Modulation ("DPWM") Noise Shaper 120. The noise shaper 120 filters out most of the conversion noise, e.g., truncation and pulse width modulation ("PWM") quantization errors, out of the band of interest. In certain embodiments, for example when the digital input signal is a digital audio signal, the band of interest is the audio band (nominally 20 Hz to 20 kHz, as is known in the art). The noise shaper 120, as described in more detail with respect to FIGS. 2 and 3, alters the spectral shape of error introduced by, for example, truncation and quantization so that the noise power is lower in the band of interest and higher outside the band of interest. For example, the noise power may be spread into a band defined by $k*f_s$. The noise shaper 120 outputs a 1-bit PWM digital signal a at $f_{clock}$, as shown in FIG. 1.

The digital signal a is input into the Finite Impulse Response ("FIR") digital-to-analog converter ("DAC") block 130, also identified as "FIR DAC". As discussed below in more detail with respect to FIGS. 4 and 5, the FIR DAC 130 converts the 1-bit PWM digital signal a into multi-level low pass analog signal b which, in certain embodiments, is a filtered audio signal. The analog signal b is input into the reconstruction amplifier 140 which operates on the analog signal b, as discussed below with respect to FIGS. 4 and 5, and outputs the analog output signal c, which is shown in FIG. 1.

Figure 2:
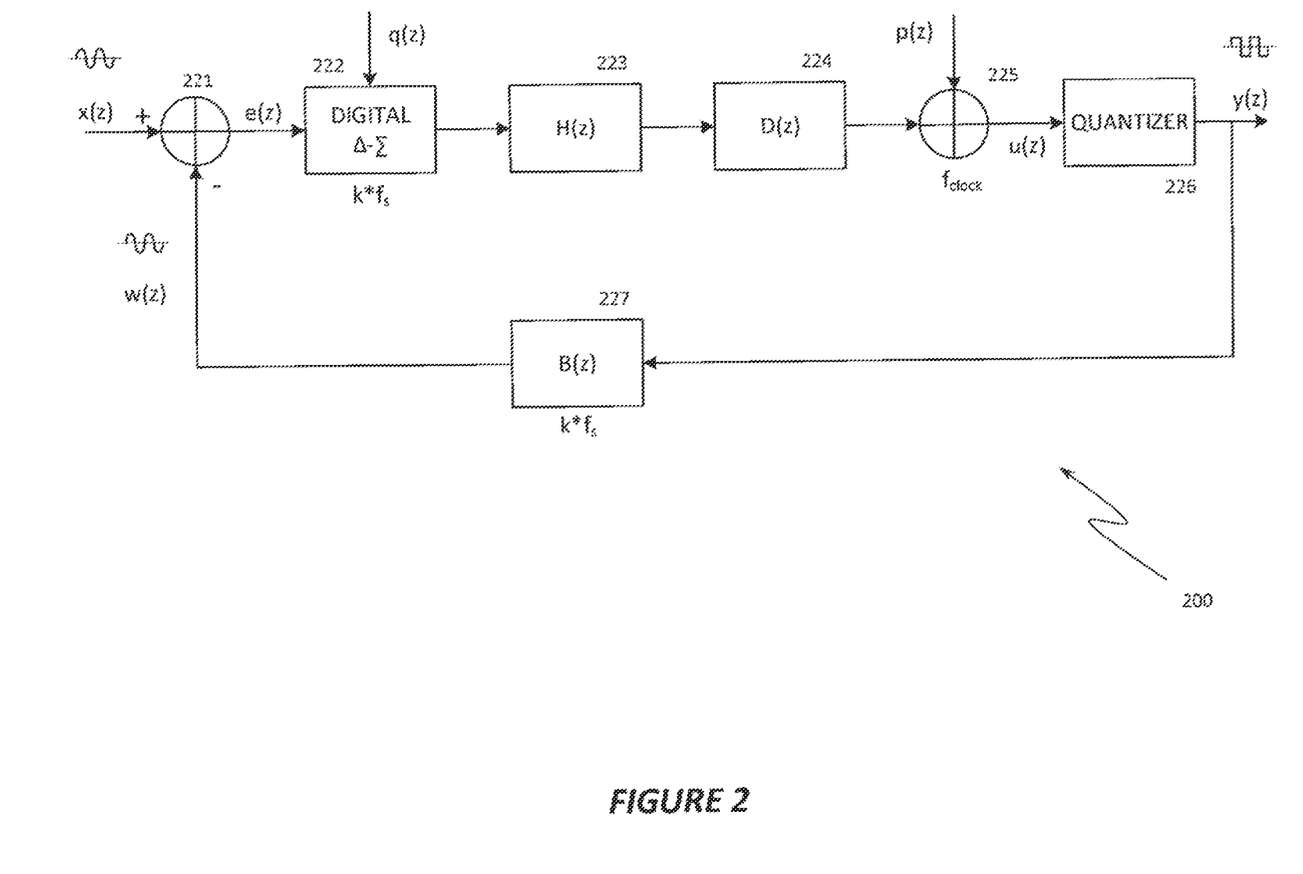
FIG. 2 is an illustration of a functional block diagram of the Digital Pulse Width Modulation ("DPWM") Noise Shaper in FIG. 1, according to an embodiment of the present subject matter.

With attention now directed towards FIG. 2, an illustration of a functional block diagram 200 of the Digital Pulse Width Modulation ("DPWM") Noise Shaper in FIG. 1 is presented, according to an embodiment of the present subject matter. Input signal x(z), which corresponds to signal m in FIG. 1 at rate $k*f_s$, is input to summing junction 221. In certain embodiments, input signal x(z) is a digital PCM signal. Also input into summing junction 221 is feedback signal w(z), which will be discussed below. The output of summing junction 221 is an error signal e(z) which is applied to the digital $\Delta\Sigma$ block 222 which is a noise shaping truncator. Also input to the digital $\Delta\Sigma$ block 222 is digital truncation error signal q(z) which represents the digital truncation error introduced due to rounding/truncating operations of a digital signal as is known in the art. The digital $\Delta\Sigma$ block 222 operates at rate $k*f_s$. The output of digital $\Delta\Sigma$ block 222 is applied to loop filter 223, the output of which is then applied to digital compensation filter 224. The digital compensation filter 224 operates to improve the phase margin of the loop, as is known in the art.

The output of the digital compensation filter 224 is applied to summing junction 225. DPWM quantization error signal p(z) is also applied to summing junction 225. Summing junction 225 operates at rate $f_{clock}$, which is a higher rate than $k*f_s$, and represents a digital pulse width modulation operation which encodes the output of digital compensation filter 224 into a pulse width modulated signal u(z). The PWM signal u(z) has a frequency of $f_{PWM}$. The PWM signal u(z) is input into quantizer 226, which operates at $f_{clock}$. The quantizer 226 performs a many-to-few mapping, as is known in the art. The output of quantizer 226 is a 1-bit PWM digital signal y(z) which corresponds to signal a at $f_{clock}$ in FIG. 1. Digital signal y(z) is also fed back through digital low pass filter 227 which performs anti aliasing filtering and samples y(z) back to $k*f$ (where $k*f_s < f_{clock}$) to thereby produce feedback signal w(z). Feedback signal w(z) is typically a multilevel digital signal.

Figure 3:
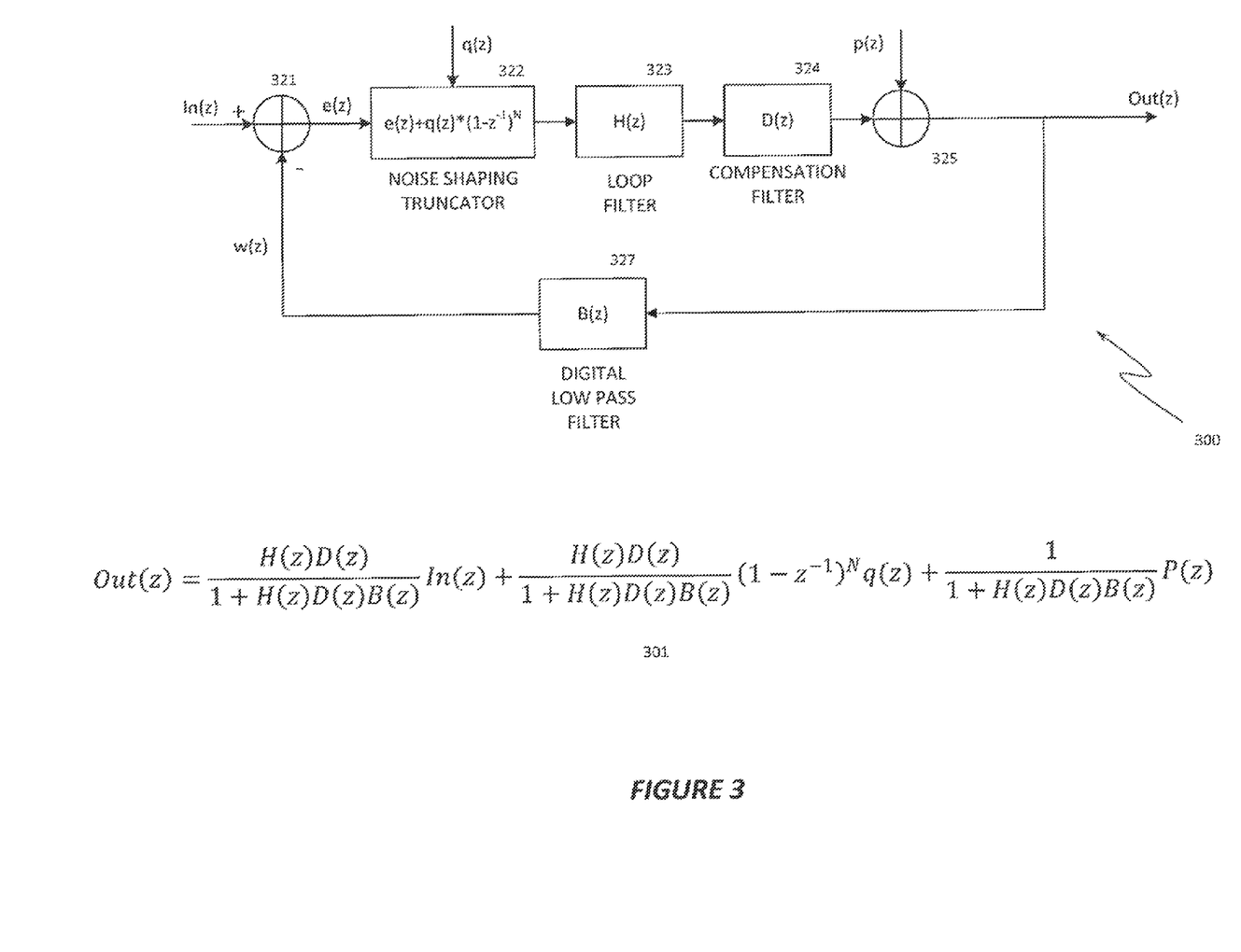
FIG. 3 is an illustration of a functional block diagram showing a loop analysis of the DPWM Noise Shaper in FIG. 2, according to an embodiment of the present subject matter.

Considering FIG. 3, functional block diagram 300, which is a z-domain linear model, is shown which illustrates a loop analysis of the DPWM Noise Shaper in FIG. 2, according to an embodiment of the present subject matter. Summing junction 321, which corresponds to summing junction 221 in FIG. 2, combines input signal In(z) and feedback signal w(z) to create error signal e(z) which is input into the noise shaping truncator 322 (which corresponds to the digital $\Delta\Sigma$ block 222 in FIG. 2). The noise shaping truncator 322 also receives digital truncation error signal q(z), as described above in FIG. 2. The noise shaping truncator 322 operates on the error signals e(z) and q(z) according to the formula:

$$e(z)+q(z)*(1-z^{-1})^N \quad \text{(Eqn. 1)}$$

where: N is the order of the noise transfer function

The output of the noise shaping truncator 322 is input to the loop filter 323, which corresponds to the loop filter 223 in FIG. 2. In an embodiment, loop filter 323 operates on its input signal according to the formula:

$$H(z) = \frac{1}{1-z^{-1}} * G_1 \quad \text{(Eqn. 2)}$$

where: $G_1$ is a DC gain value

The output of loop filter 323 is input to compensation filter 324, which corresponds to digital compensation filter 224 in FIG. 2. In an embodiment, compensation filter 324 operates on its input signal according to the formula:

$$D(z) = \frac{z-a}{(z-b)(z-c)} * G_2 \quad \text{(Eqn. 3)}$$

where:
$G_2$ is a DC gain value
a, b, and c are constants

The values of a, b, and c are chosen so that a represents a filter zero frequency location, and b and c represent filter pole frequency locations.

The output of compensation filter 324 is input to summing junction 325, which corresponds to summing junction 225 in FIG. 2. From a linearized signal processing point of view, PWM quantization error signal p(z) is also applied to summing junction 325. The output of summing junction 325 is signal Out(z). Note that in FIG. 3 there is no block which corresponds to the quantizer 226 in FIG. 2 since the quantizer 226 does not impact the z-domain linear model represented by FIG. 3.

The output signal Out(z) is fed back through the digital low pass filter 327, which corresponds to digital low pass filter 227 in FIG. 2. In an embodiment, digital low pass filter 327 operates on its input signal, Out(z), according to the formula:

$$B(z) = \frac{1}{z-d} * G_3 \quad \text{(Eqn. 4)}$$

where:
$G_3$ is a DC gain value
d is a constant

The value of d, is chosen in such a manner that low pass filtering of undesired signal frequencies is performed according to the applicable design specifications for the circuit. As a non-limiting example, the value of d may be chosen such that signals in the audible range (e.g., up to 20 kHz) are passed and signals beyond 20 kHz are suppressed. The output of the digital low pass filter 327 is the feedback signal w(z) that is applied to the summing junction 321 as discussed above.

As is known in the art, analysis of the z-domain linear model 300 results in the following equation 301:

$$Out(z) = \frac{H(z)D(z)}{1+H(z)D(z)B(z)} In(z) + \frac{H(z)D(z)}{1+H(z)D(z)B(z)}(1-z^{-1})^N q(z) + \frac{1}{1+H(z)D(z)B(z)} p^z \quad \text{(Eqn. 5)}$$

For the operation of the DPWM Noise Shaper 120 of FIG. 1, represented by Eqn. 5 above, the input signal should be impacted as little as possible in the band of interest. Therefore, there is a need to oversample the input signal which is accomplished by the use of the interpolation filter 110 to convert the digital input signal n at rate $f_s$ to the digital signal m at rate $k*f_s$ (which corresponds to incoming signal In(z) in FIG. 3 and Eqn. 5, above. Analyzing Eqn. 5, the term in the denominator of each of the three terms on the right-hand side of the equation, 1+H (z)D(z)B(z), should ideally be large to diminish error terms. However, if the denominator is too large, the loop will become unstable. Typical values for the denominator term for a high fidelity system may be >100 dB, although other values are contemplated by embodiments of the present subject matter.

Considering now the first term on the right-hand side of Equation 5, this term represents the incoming signal In(z) and therefore is in the band of interest. Ideally, the response of the z-domain linear model 300 to this term is flat. In order to accomplish this, the value of $$\frac{1}{B(z)}$$

should be approximately unity gain, i.e., should act as a low pass filter in the band of interest. Considering now the second and third terms on the right-hand side of Equation 5, these terms represent error signals q(z) and p(z), respectively, and ideally the z-domain linear model 300 will suppress these terms in the band of interest and will shape the power of the error signals q(z) and p(z) such that the power of these signals will appear out of the band of interest. In the second term, the expression $(1-z^{-1})^N$ is a differentiator which acts like a high pass filter: it will attenuate low frequencies but will allow high frequencies to pass. In this manner, the frequency spectrum of incoming signals are modified such that low frequency signals are suppressed and moved to higher out-of-band frequency regions. Thus, the values in Equation 5 (i.e., G1, G2, G3, a, b, c, and d) are chosen such that for the specific circuitry in which the DPWM Noise Shaper 120 is used, the filters H(z), D(z), and B(z) in the z-domain linear model 300 operate as described above, i.e., for the suppression of noise in the band of interest.

The above-described apparatus is designed to suppress both truncation errors and DPWM quantization errors by spectrally shaping most of the power associated with these errors out of the band of interest by employing feedback. Additionally, the z-domain linear model 300 shown in FIG. 3 can be easily compensated by the included digital filter D(z) and the loop dynamic response can also be optimized by the digital filter D(z).

Figure 4:
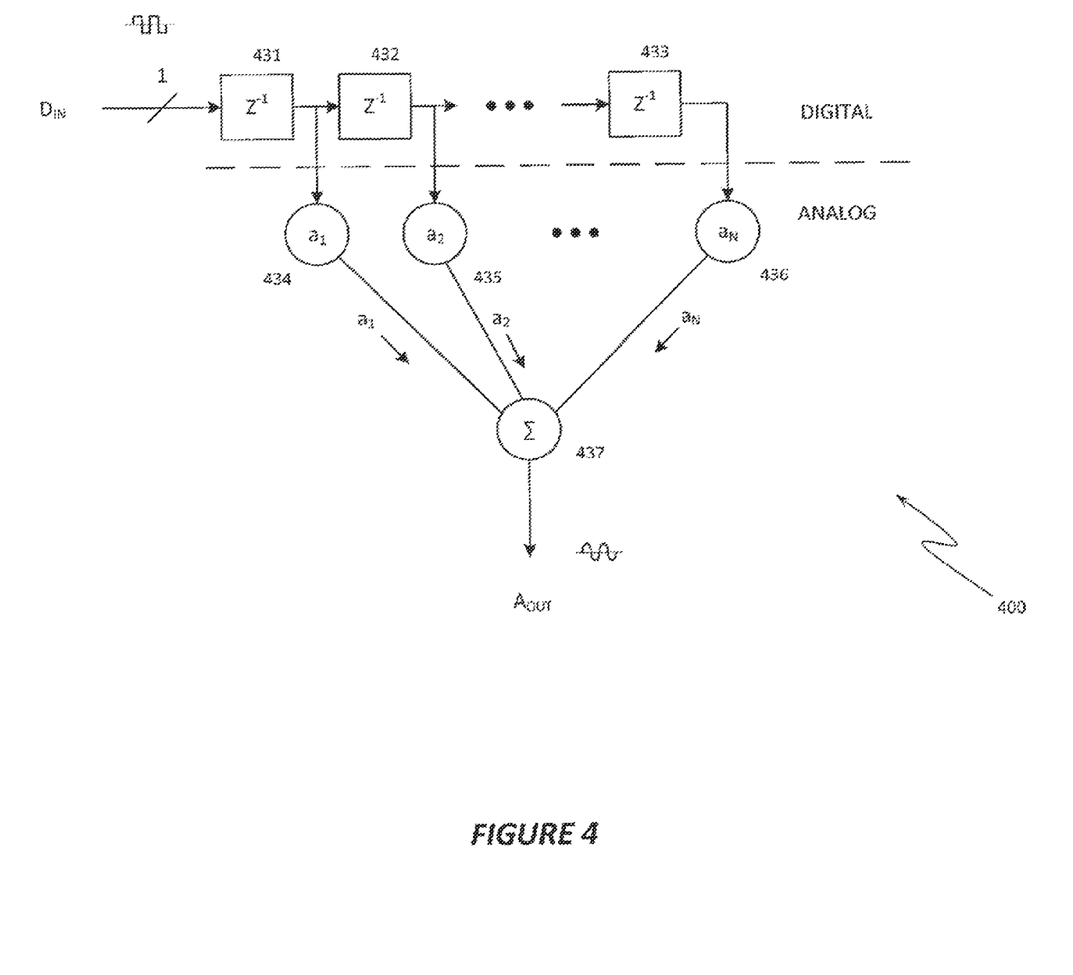
FIG. 4 is an illustration of a functional block diagram for the Finite Impulse Response ("FIR") digital-to-analog converter ("DAC") block in FIG. 1, according to an embodiment of the present subject matter.

FIG. 4 is an illustration of a functional block diagram for the FIR DAC 400 which corresponds to block 130 in FIG. 1, according to an embodiment of the present subject matter. In an embodiment, the input signal $D_{IN}$ is the noise shaper 120 output signal a, which is a 1-bit PWM digital signal at $f_{clock}$, as shown in FIG. 1. The FIR DAC 400 in this embodiment is an N-tap FIR filter as shown in FIG. 4 where the filter coefficients $a_1, a_2, \ldots, a_N$, (designated 434, 435, through 436, respectively) are analog while the delay elements 431, 432, through 433 are implemented digitally using a shift register. The filter coefficients $a_1, a_2, \ldots, a_N$, are implemented by either current sources or by a charge in a capacitor. Other implementations for the FIR DAC 400 are contemplated by the present subject matter. For example, FIR DAC 400 may be implemented in a continuous time manner, for example using current steering, as is known in the art. As a further example, FIR DAC 400 may be implemented in a discrete time manner, for example using switched capacitors, as is known in the art. The analog quantities $a_1, a_2, \ldots, a_N$ (current or charge) are summed in summer 437 to form analog output signal $A_{OUT}$.

The transfer function for FIR DAC 400 is:

$$H(z) = \frac{A_{OUT}}{D_{IN}(z)} = a_1 z^{-1} + a_2 z^{-2} + \ldots + a_N z^{-N} \quad \text{(Eqn. 6)}$$

As can be seen from FIG. 4, FIR DAC 400 converts the single-bit serial input signal $D_{IN}$ into a multi-level parallel continuous-time output signal $A_{OUT}$. One of the advantages of the above-described apparatus is that FIR DAC 400 is inherently linear since the digital implementation of the delay elements 431, 432, through 433 is linear and any mismatch among the analog coefficient elements 434, 435, through 436 (implemented as either current sources or capacitors) simply degrade the gain stop-band response and phase response. A further advantage of FIR DAC 400 is that since the input signal $D_{IN}$ is a PWM signal, FIR DAC 400 is resistant to inter-symbol interference ("ISI").

A still further advantage is that FIR DAC 400 is controlled by delayed versions of the same input signal, $D_{IN}$. Since $D_{IN}$ is only a 1-bit signal, there are no harmonic distortion errors injected due to a multi-bit input signal. For example, if the input signal $D_{IN}$ were to be a multi-bit PCM (pulse code modulation) signal which, for example, has 8-bit words in parallel, an error in any one of those bits will produce a distortion of the input signal. In a FIR DAC having a PCM input signal, the control signals are comprised of different bit positions of the PCM signal and thus comprise harmonics of the sinusoidal input. Errors thus introduced will cause harmonic distortion which will negatively affect the linearity of the FIR DAC. In order to combat the harmonic distortion errors, a FIR DAC having a PCM (or other multi-bit) input signal will require linearization circuitry, such as Dynamic Element Matching ("DEM") in order to achieve a sufficient level of linearity.

Figure 5:
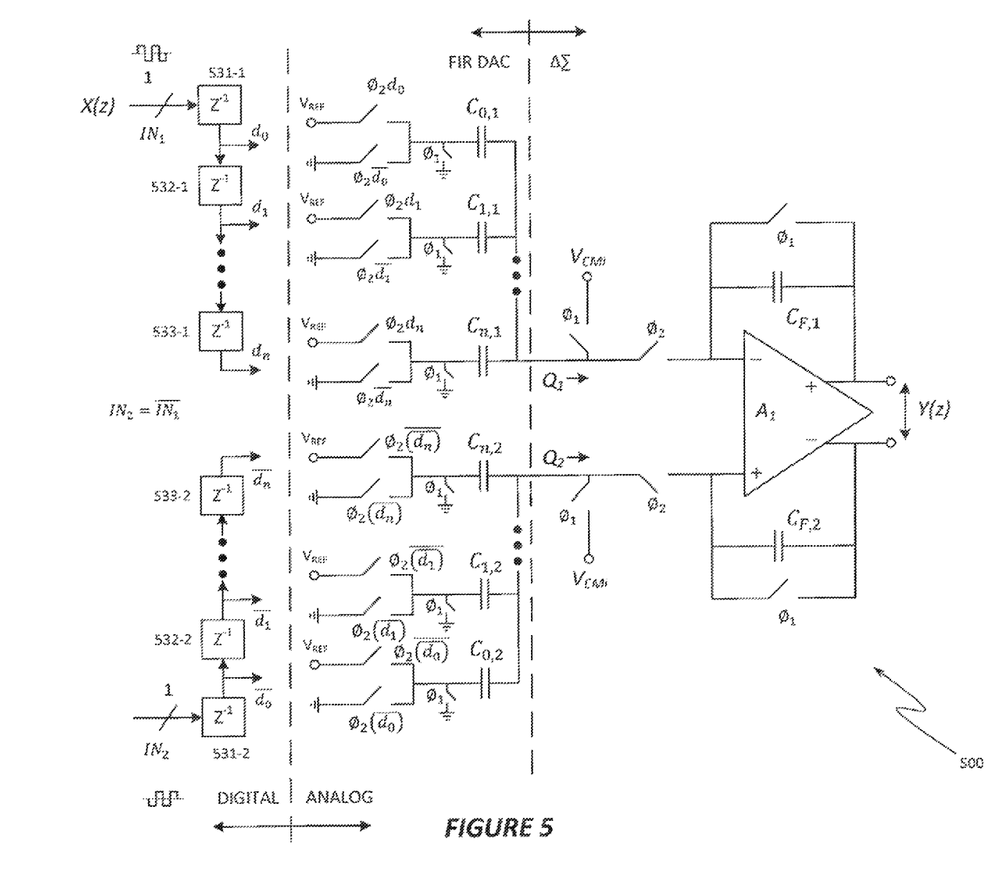
FIG. 5 is an illustration of a functional block diagram for the FIR DAC block combined with the reconstruction amplifier in FIG. 1, according to an embodiment of the present subject matter.

Regarding FIG. 5, presented is an illustration of a functional schematic diagram 500 for the hybrid DAC filter and reconstruction amplifier which corresponds to block 130 and block 140 in FIG. 1, according to an embodiment of the present subject matter. In FIG. 5, the input signal $IN_1$ is the noise shaper 120 output signal a, which is a 1-bit PWM digital signal at $f_{clock}$, as shown in FIG. 1. The input signal $IN_1$ is inverted, by any known method, to produce signal $IN_2$ which is also a 1-bit PWM digital signal at $f_{clock}$. In FIG. 5, the hybrid DAC filter portion of schematic diagram 500 in this embodiment is an N-tap FIR filter where the filter coefficients are analog while the delay elements 531-1, 532-1, through 533-1 and 531-2, 532-2, through 533-2 are implemented digitally using shift registers. The filter coefficients in FIG. 5 are implemented by the charge in the capacitors $C_{0,1}, C_{1,1}$, through $C_{n,1}$ and $C_{0,2}, C_{1,2}$, through $C_{n,2}$, respectively, as described below. Other implementations for the FIR DAC in schematic diagram 500 are contemplated by the present subject matter, for example in a continuous time manner or a discrete time manner, as is known in the art.

The hybrid DAC portion of schematic diagram 500 operates in two modes: a reset mode and an information capture mode. In the reset mode, the switches marked $Ø_1$ are closed thereby allowing the hybrid DAC to reset. In the information capture mode, the switches marked $Ø_2$ are closed to allow information flow through the hybrid DAC. The timings of the $Ø_1$ and $Ø_2$ switches are taken from clocks operating at $f_{clock}$. The clock triggering the $Ø_1$ switches is offset from the clock triggering the $Ø_2$ switches so that the $Ø_1$ and $Ø_2$ switches are not closed at the same time.

In operation, each output of the shift registers controls a set of switches for the associated filter coefficient capacitor. For shift register 531-1, the output signal $d_0$ operates the switches for charging capacitor $C_{0,1}$, i.e., the switches designated $Ø_2 d_0$ and $Ø_2 \overline{d_0}$. If signal $d_0$ is high, the switch $Ø_2 d_0$ is closed thereby connecting capacitor $C_{0,1}$ to $V_{REF}$. If signal $d_0$ is low, the switch $Ø_2 \overline{d_0}$ is closed thereby connecting capacitor $C_{0,1}$ to ground. Similarly, for shift register 532-1, the output signal $d_1$ operates the switches for charging capacitor $C_{1,1}$, i.e., the switches designated $Ø_2 d_1$ and $Ø_2 \overline{d_1}$. If signal $d_1$ is high, the switch $Ø_2 d_1$ is closed thereby connecting capacitor $C_{1,1}$ to $V_{REF}$. If signal $d_1$ is low, the switch $\varnothing_2\overline{d_1}$ is closed thereby connecting capacitor $C_{1,1}$ to ground. Each of the remaining shift registers, up through 533-1, operate in a similar manner. The resulting output from capacitors $C_{0,1}$, $C_{1,1}$, through $C_{n,1}$, designated $Q_1$, is applied to the amplifier $A_1$ as discussed below.

Likewise, the shift registers receiving the $IN_2$ signal (which is the inverse of $IN_1$) operate in a similar manner. For shift register 531-2, the output signal $\overline{d_0}$ operates the switches for charging capacitor $C_{0,2}$, i.e., the switches designated $\varnothing_2(\overline{d_0})$ and $\varnothing_2\overline{(\overline{d_0})}$. If signal $\overline{d_0}$ is high, the switch $\varnothing_2(\overline{d_0})$ is closed thereby connecting capacitor $C_{0,2}$ to ground. If signal $\overline{d_0}$ is low, the switch $\varnothing_2\overline{(\overline{d_0})}$ is closed thereby connecting capacitor $C_{0,2}$ to $V_{REF}$. Similarly, for shift register 532-2, the output signal $\overline{d_1}$ operates the switches for charging capacitor $C_{1,2}$, i.e., the switches designated $\varnothing_2\overline{d_1}$ and $\varnothing_2(\overline{d_1})$. If signal $\overline{d_1}$ is high, the switch $\varnothing_2(\overline{d_1})$ is closed thereby connecting capacitor $C_{1,2}$ to ground. If signal $\overline{d_1}$ is low, the switch $\varnothing_2\overline{(\overline{d_1})}$ is closed thereby connecting capacitor $C_{1,2}$ to $V_{REF}$. Each of the remaining shift registers, up through 533-2, operate in a similar manner. The resulting output from capacitors $C_{0,2}$, $C_{1,2}$, through $C_{n,2}$, designated $Q_2$, is applied to the amplifier $A_1$ as discussed below. As can be seen from FIG. 5, during the reset mode (i.e., when the switches marked $\varnothing_1$ are closed) the right hand side plates of the capacitors $C_{0,1}$, $C_{1,1}$, through $C_{n,1}$, and the capacitors $C_{0,2}$, $C_{1,2}$, through $C_{n,2}$ are connected to voltage $V_{CMi}$, which is a common mode voltage that also sets the virtual analog ground for the amplifier $A_1$.

The transfer function for the hybrid DAC in schematic diagram 500 is:

$$H(z) = \frac{Y(z)}{X(z)} = \sum_{i=0}^{n} \frac{C_i}{C_F} z^{-1} \qquad \text{(Eqn. 6)}$$

As can be seen from FIG. 5, the hybrid DAC in schematic diagram 500 converts the single-bit serial input signals $IN_1$ and $IN_2$ into a multi-level parallel continuous-time output signals $Q_1$ and $Q_2$, respectively. One of the advantages of the above-described apparatus is that the FIR DAC is inherently linear since the digital implementation of the delay elements 531-1, 532-1, through 533-1, and 531-2, 532-2, through 533-2 is linear and any mismatch among the analog coefficient elements $C_{0,1}$, $C_{1,1}$, through $C_{n,1}$ and $C_{0,2}$, $C_{1,2}$, through $C_{n,2}$, (implemented as either current sources or, as shown in schematic diagram 500, as capacitors) simply degrade the gain stop-band response and phase response. A further advantage of the hybrid DAC is that since the input signals $IN_1$ and $IN_2$ are each a PWM signal, the hybrid DAC is resistant to inter-symbol interference ("ISI").

A still further advantage is that the hybrid DAC in schematic diagram 500 is controlled by delayed versions of the same input signals, signals $IN_1$ and $IN_2$. Since signals $IN_1$ and $IN_2$ are each only a 1-bit signal, there are no harmonic distortion errors injected due to a multi-bit input signal. For example, if the input signals $IN_1$ and $IN_2$ were to be multi-bit PCM (pulse code modulation) signals which, for example, has 8-bit words in parallel, an error in any one of those bits will produce a distortion of the input signal. In a hybrid DAC having a PCM input signal, the control signals are comprised of different bit positions of the PCM signal and thus comprise harmonics of the sinusoidal input. Errors thus introduced will cause harmonic distortion which will negatively affect the linearity of the hybrid DAC. In order to combat the harmonic distortion errors, a hybrid DAC having a PCM (or other multi-bit) input signal will require linearization circuitry, such as Dynamic Element Matching ("DEM") in order to achieve a sufficient level of linearity.

The $\Delta\Sigma$ portion of the schematic diagram 500 receives the output signals $Q_1$ and $Q_2$ from the hybrid DAC portion of the schematic diagram 500. Signals $Q_1$ and $Q_2$ are applied to amplifier $A_1$ which includes feedback capacitors $C_{F,1}$ and $C_{F,2}$ so that amplifier $A_1$ is an integrator operating as a low pass filter so that the input signals $Q_1$ and $Q_2$ are low-pass filtered to create the analog output signal $Y(z)$.

Figure 6:
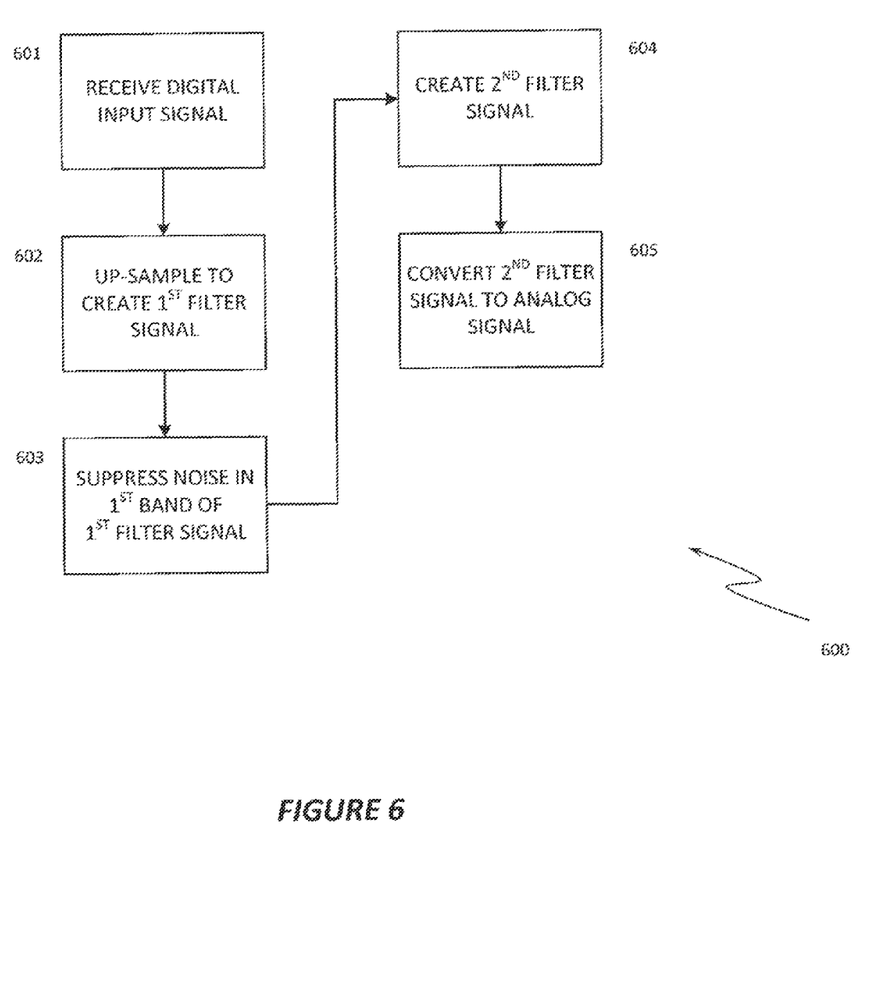
FIG. 6 is a flow chart for a method for digital-to-analog conversion according to an embodiment of the present subject matter.

With attention now drawn to FIG. 6, a flow chart 600 is presented for a method for digital-to-analog conversion according to an embodiment of the present subject matter. At block 601, a digital input signal is received. At block 602, the digital input signal is up-sampled to create a first filter signal, which is a digital signal. At block 603, noise in a first band of the first filter signal is suppressed. This noise is digital truncation error noise and/or quantization error noise. At block 604, a second filter signal, which is a digital signal, is created from the noise-suppressed first filter signal. At block 605, the second filter signal is converted to an analog signal.

Figure 7:
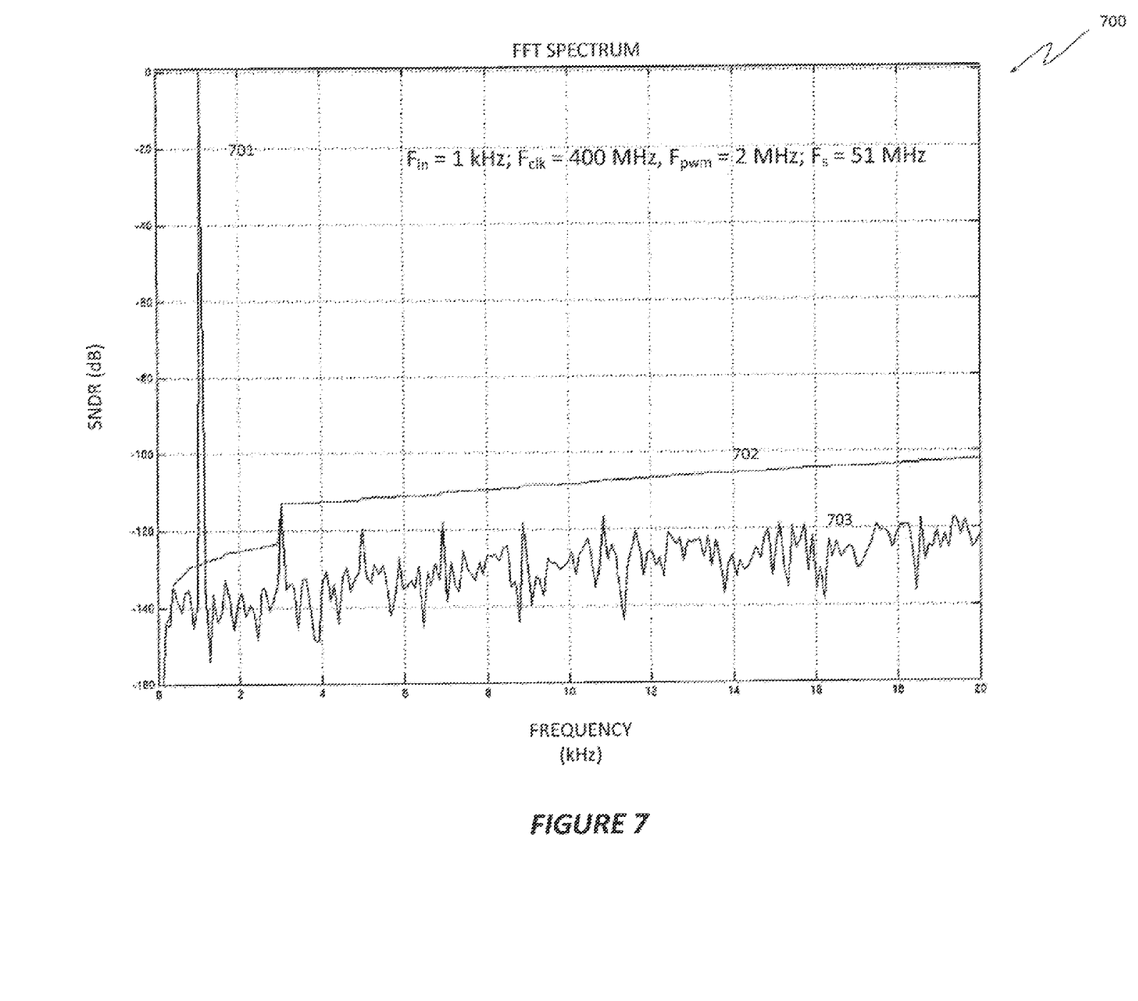
FIG. 7 is an illustration of an input/output spectrum for a digital-to-analog converter according to an embodiment of the present subject matter.

FIG. 7 is an illustration 700 of a simulated input/output spectrum for a digital-to-analog converter according to an embodiment of the present subject matter. As seen in FIG. 7, the input frequency=1 kHz, $f_{clock}$=400 MHz, $f_{PWM}$=2 MHz, and $f_s$=51 MHz. The output spectrum spans the frequency range of 20 Hz to 20 kHz, which is the audio band. Graphed data 703 is the output spectrum showing the input signal as the peak 701. The graphed line 702 shows the growth of the output noise signal. As can been readily seen from FIG. 7, the output noise signal is well below the input signal (by more than 100 dB SNR) and the output noise signal is shaped so that it increases with increasing frequency away from the input signal.

Figure 8:
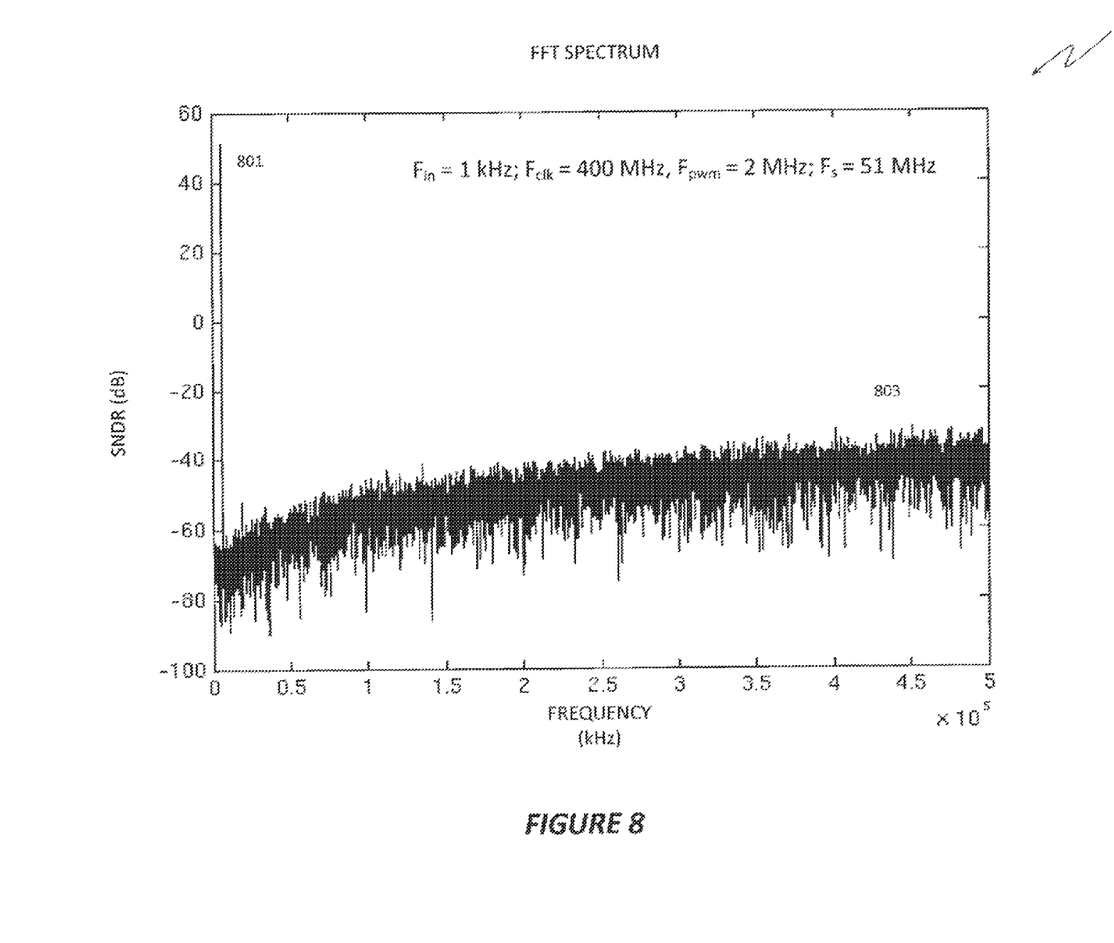
FIG. 8 is an illustration of an input/output spectrum across a wider frequency range for a digital-to-analog converter according to an embodiment of the present subject matter.

FIG. 8 is an illustration 800 of a simulated input/output spectrum for a digital-to-analog converter according to an embodiment of the present subject matter. As seen in FIG. 8, the input frequency=1 kHz, $f_{clock}$=400 MHz, $f_{PWM}$=2 MHz, and $f_s$=51 MHz, which is the same as for FIG. 7. The output spectrum spans the frequency range of 20 Hz to 500 kHz, which is broader than that shown in FIG. 7. Graphed data 803 is the output spectrum showing the input signal as the peak 801. Similar to FIG. 7, FIG. 8 shows the output noise signal is well below the input signal and the output noise signal is shaped so that it increases with increasing frequency away from the input signal and out of the band of interest.

As discussed above, an embodiment of the present subject matter includes a system for converting a digital signal to an analog signal where the system includes an interpolation filter having an input for receiving a digital input signal, a pulse width modulated noise shaper filter, and a digital to analog converter having a finite impulse response filter, an integrator, and an output for outputting an analog signal.

A further embodiment of the present subject matter includes a system for converting a digital signal to an analog signal where the system includes an interpolation filter having an input for receiving a digital signal and an output for outputting an interpolation signal. The digital signal spans a first predetermined band, and the interpolation signal spans a second predetermined band which is wider than the first predetermined band and includes the first predetermined band. The system further includes a noise shaper filter having an input for receiving the interpolation signal, a first circuit for suppressing errors in the first predetermined band of the interpolation signal; and an output for outputting a pulse width modulation ("PWM") signal, where the PWM signal is a one-bit code signal. The system also includes a digital to analog converter having an input for receiving the PWM signal, a second circuit for converting the PWM signal into a converted signal where the converted signal is a multi-level parallel signal. Still further, the system includes an output for outputting the converted signal and a reconstruction amplifier having an input for receiving the converted signal, a third circuit for changing the converted signal into an analog signal, and an output for outputting an analog signal.

According to an embodiment of the present subject matter, a method is described for converting a digital signal to an analog signal. The method includes the steps of receiving a digital input signal which spans a first predetermined band, up-sampling the digital input signal to create a first filter signal which spans a second predetermined band which includes the first predetermined band and is wider than the first predetermined band, suppressing noise in the first predetermined band of the first filter signal, creating a second filter signal from the noise-suppressed first filter signal, and converting the second filter signal to an analog signal using a finite impulse response filter and an integrator.

Certain embodiments of the present subject matter include a PWM DAC system to convert digital signals into analog signals containing one or more of the following features: an interpolation filter configured to up-sample an input digital signal; a digital DPWM noise shaping modulator to suppress in-band quantization errors due to digital PWM truncation errors; a FIR DAC to convert a 1-bit digital PWM signal into an analog signal without the complexity and problems associated with DEM and/or ISI; and a reconstruction filter coupled to the FIR DAC output to generate an output analog signal.

While some embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

We claim:

1. A system for converting a digital signal to an analog signal, comprising:
    an interpolation filter including an input for receiving a digital input signal;
    a pulse width modulated noise shaper filter; and
    a digital to analog converter comprising a finite impulse response filter having N-taps and N tap weights, wherein N is a predetermined number, and wherein each of said N-taps is implemented digitally and each of said N tap weights is implemented non-digitally using switched capacitors; and
    an output for outputting an analog signal.

2. The system of claim 1 wherein said digital input signal spans a first predetermined band, and wherein said interpolation filter up-samples said digital input signal by a predetermined value and outputs a first filter signal which spans a second predetermined band which includes said first predetermined band and is wider than said first predetermined band.

3. The system of claim 2 wherein said noise shaper filter receives said first filter signal, suppresses conversion noise in said first predetermined band, and outputs a second filter signal wherein said second filter signal spans said second predetermined band.

4. The system of claim 2 wherein said first predetermined band is within an audio signal sampling rate range.

5. The system of claim 2 wherein said predetermined value is in the range of 32-2048.

6. The system of claim 1 wherein said digital input signal is a pulse code modulation signal.

7. The system of claim 1 wherein said digital input signal is a digital audio signal.

8. A system for converting a digital signal to an analog signal, comprising:
    an interpolation filter comprising an input for receiving said digital signal and an output for outputting an interpolation signal, wherein said digital signal spans a first predetermined band, and wherein said interpolation signal spans a second predetermined band which is wider than said first predetermined band and includes said first predetermined band;
    a noise shaper filter comprising:
        an input for receiving said interpolation signal;
        a first circuit for suppressing errors in said first predetermined band of said interpolation signal; and
        an output for outputting a pulse width modulation ("PWM") signal, wherein said PWM signal is a one-bit code signal;
    a digital to analog converter comprising:
        an input for receiving said PWM signal;
        a finite impulse response filter having N-taps and N tap weights for converting said PWM signal into a converted signal wherein said converted signal is a multi-level signal, wherein N is a predetermined number, and wherein each of said N-taps is implemented digitally and each of said N tap weights is implemented in analog using switched capacitors; and
        an output for outputting said converted signal;
    and
    a reconstruction amplifier comprising:
        an input for receiving said converted signal;
        a third circuit for changing said converted signal into an analog signal; and
        an output for outputting said analog signal.

9. The system of claim 8 wherein said digital input signal is a pulse code modulation signal.

10. The system of claim 8 wherein said first predetermined band is in the range of 16-400 kHz.

11. The system of claim 8 wherein said first circuit includes a noise shaping truncator, a loop filter, a compensation filter, and a digital low pass filter.

12. The system of claim 8 wherein said errors comprise quantization errors and truncation errors.

13. The system of claim 8 wherein said third circuit includes an integrator which sums said converted signal and performs low pass filtering.

14. The system of claim 13 wherein said finite impulse response filter and said third circuit operate in combination to produce a transfer function H (z) in the form of:

$$H(z) = \frac{Y(z)}{X(z)} = \sum_{i=1}^{n} \frac{C_i}{C_F} z^{-1}$$

where:
    Y(z) is said analog signal
    X(z) is said PWM signal
    $C_i$ are each a predetermined analog coefficient
    $C_F$ is a predetermined analog coefficient
    $z^{-1}$ is a predetermined delay element implemented digitally
    n is a predetermined number.

15. A method for converting a digital signal to an analog signal, the method comprising the steps of:

receiving a digital input signal which spans a first predetermined band;
up-sampling the digital input signal to create a first filter signal which spans a second predetermined band which includes the first predetermined band and is wider than the first predetermined band;
suppressing noise in the first predetermined band of the first filter signal;
creating a second filter signal from the noise-suppressed first filter signal; and
converting the second filter signal to an analog signal using a finite impulse response filter and an integrator,
wherein the finite impulse response filter has N-taps and N tap weights wherein N is a predetermined number, and wherein each of said N-taps is implemented digitally and each of said N tap weights is implemented non-digitally using switched capacitors.

16. The method of claim 15 wherein said second filter signal is a one-bit code signal.

17. The method of claim 15 wherein the converting step includes producing a transfer function H (z) in the form of:

$$H(z) = \frac{Y(z)}{X(z)} = \sum_{i=1}^{n} \frac{C_i}{C_F} z^{-1}$$

where:
- Y(z) is said analog signal
- X(z) is said PWM signal
- $C_i$ are each a predetermined analog coefficient
- $C_F$ is a predetermined analog coefficient
- $z^{-1}$ is a predetermined delay element implemented digitally
- n is a predetermined number.

18. The method of claim 15 wherein the digital input signal is a pulse code modulation signal.

19. The method of claim 15 wherein said first predetermined band is within an audio signal sampling rate range.

20. The method of claim 15 wherein said digital input signal is a digital audio signal.

* * * * *